United States Patent [19]

Markow et al.

[11] Patent Number: 5,007,035

[45] Date of Patent: Apr. 9, 1991

[54] DISTANCE PULSE AVERAGING UNIT

[75] Inventors: Paul A. Markow, Huntsville; Kevin R. Hammond, Madison; Donald E. Hutchings, Decatur, all of Ala.

[73] Assignee: Chrysler Corporation, Highland Park, Mich.

[21] Appl. No.: 546,608

[22] Filed: Jun. 29, 1990

[51] Int. Cl.[5] .......................... G04F 8/00; G01R 23/02

[52] U.S. Cl. .................................. 368/118; 324/78 R; 324/166

[58] Field of Search ................................ 368/113-120; 364/561, 565, 569; 324/161, 166, 78 R, 78 D; 377/20

[56] References Cited

U.S. PATENT DOCUMENTS

| | | | |
|---|---|---|---|
| 4,569,599 | 2/1986 | Bolkow et al. | 368/120 |
| 4,581,713 | 4/1986 | Fennel | 364/565 |
| 4,603,292 | 7/1986 | Russell | 368/120 |
| 4,884,227 | 11/1989 | Watanabe | 364/565 |
| 4,891,588 | 1/1990 | Fujioka et al. | 324/166 |

*Primary Examiner*—Vit W. Miska

*Attorney, Agent, or Firm*—Wendell K. Fredericks

[57] ABSTRACT

A distance pulse unit measures the period between valid edges of asymmetrically shaped pulses from a distance pulse sensor. The unit counts individual clock pulse or averages eight individual clock pulses used to determine the period. The averaging occurs if the frequency of the sensor pulses are above a chosen frequency. The averaging aids in reducing the effects of the asymmetry of the sensor pulses.

4 Claims, 10 Drawing Sheets

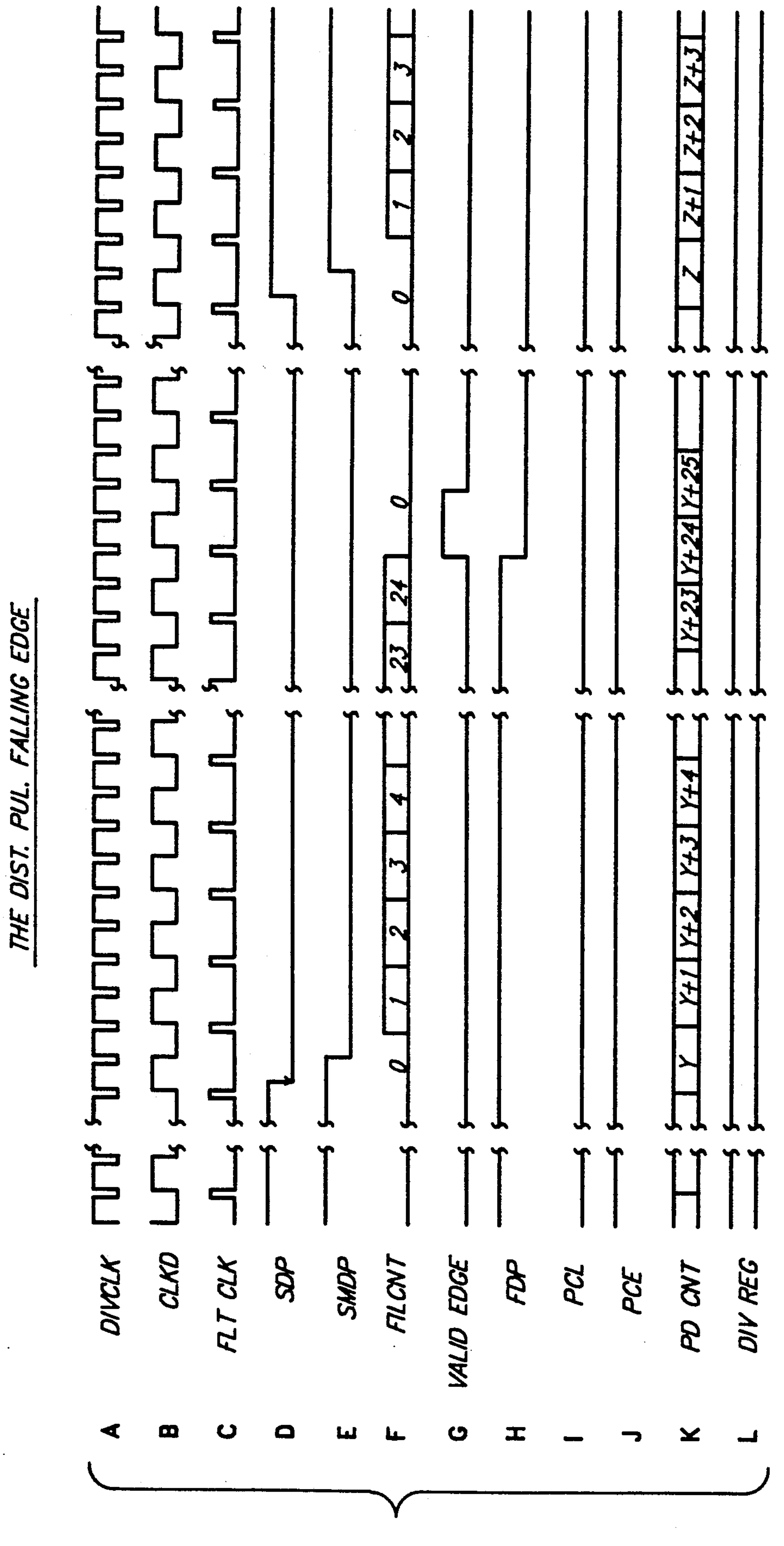
THE DIST. PUL. FALLING EDGE
A DIVCLK
B CLKD
C FLT CLK
D SDP
E SMDP
F FILCNT
G VALID EDGE
H FDP
I PCL
J PCE
K PD CNT
L DIV REG
0
1
2
3
4
23
24
0
0
1
2
3
Y
Y+1
Y+2
Y+3
Y+4
Y+23
Y+24
Y+25
Z
Z+1
Z+2
Z+3

DISTANCE PULSE AVERAGING UNIT

BACKGROUND OF THE INVENTION

1. Field of the Invention

The present invention relates generally to measuring the period of square wave signals and, in particular, measuring the period of one pulse or the average of 8 pulses for use with frequency measurements.

2. Description of the Prior Art

A distance sensor, a conventional electromechanical transducer, usually mounts on a portion of a drivetrain of a vehicle and acts as a ground switch providing a series of on and off ground switch closures at a defined rate, e.g., 8,000 switch closures per mile traveled. 8,000 pulses per mile sensors usually emit 8 pulses per revolution of a sensor shaft. However, the pulses are not always outputted symmetrically as the sensor shaft rotates. This causes asymmetrical period readings of the sensor pulses. Also, the switch closures generate undesirable contact bounce. As much as 50 microseconds of bounce may result during the operation of an inexpensive, noisy distance pulse sensor.

In an effort to deal with the asymmetrical output pulses and the undesirable contact bounce characteristics of noisy sensors, a search was made to come up with a scheme to compensate for the asymmetry and the contact bounce characteristics. This search resulted in the present invention which measures the period of pulses outputted by the distance sensor.

BRIEF SUMMARY OF THE INVENTION

A period measurement unit measures periods between rising edges of asymmetrical pulses from a measurand sensor. Clock means generate from a reference oscillator a first clock signal for measuring a period of each sensor pulse if the frequency of the sensor pulses ranges below a chosen frequency and a second clock signal if the sensor pulses ranges above the chosen frequency. The two different frequencies minimizing the asymmetrical affects of the measurand pulses. The clock means also generates a third clock signal used to determine the occurrences of valid rising edges of the sensor pulses.

A period counter module counts the number of pulses of the first or second clock signals occurring between a first valid edge and a next valid edge of the sensor pulses and a storage register stores a count of that number of clock pulses received during the interval between valid edges.

IN THE DRAWINGS

FIGS. 7 through 15 depict timing diagrams illustrative of the various signals with respect to a reference oscillator of the measuring unit of FIG. 1

DESCRIPTION OF THE PREFERRED EMBODIMENT

Figure 1:
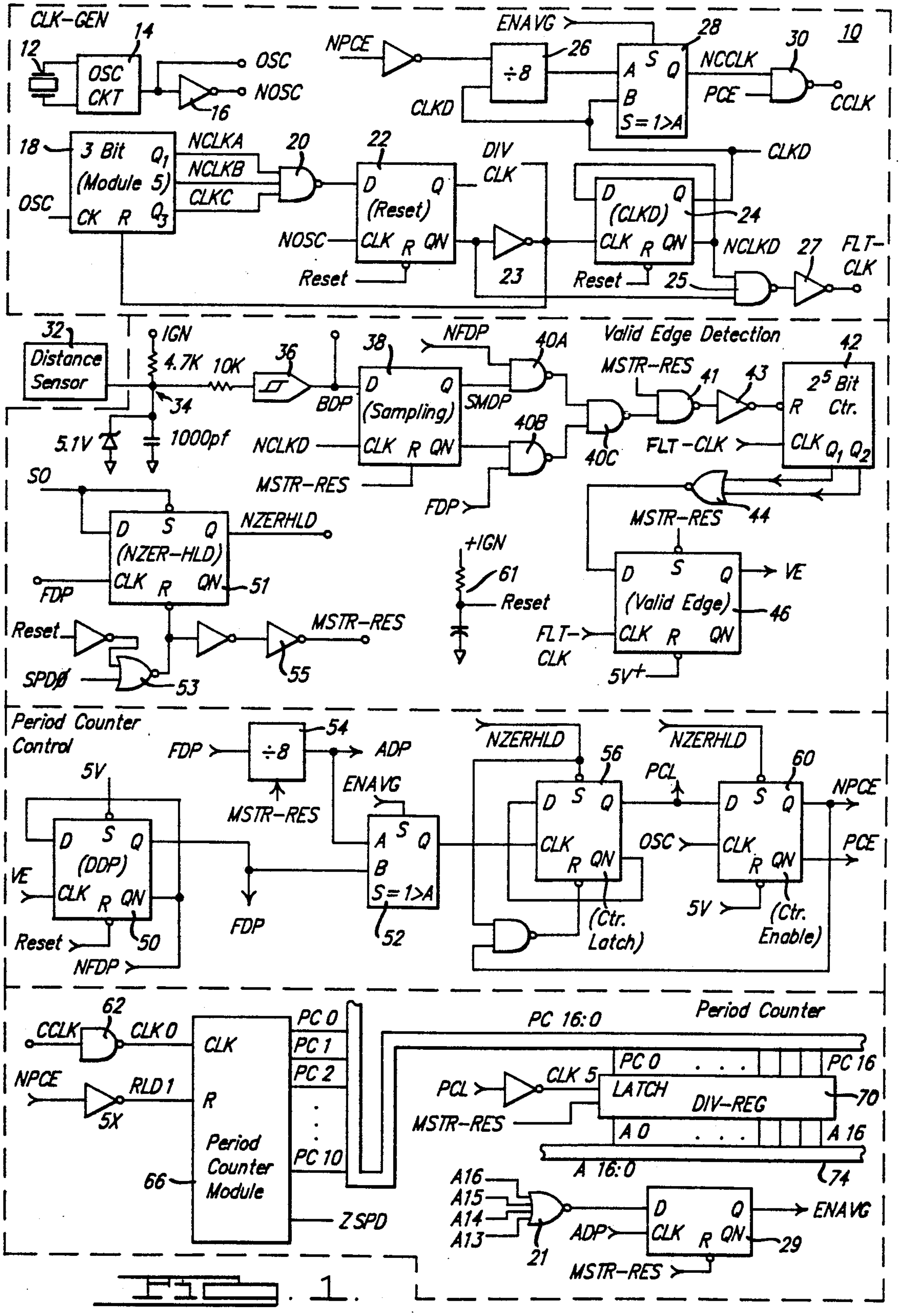
FIG. 1 illustrate a period measuring unit embodying the principles of the present invention.

With reference to FIG. 1, a schematic diagram illustrates a circuit for measuring the period of the distance pulses being outputted by the distance sensor. Measures of period permit deriving measures of speed.

To determine speed, this circuit measures the period of the distance pulses. The period of the distance pulse results from multiplying a clocked period times a number of clock cycles occurring during the distance pulse period.

Assuming an analog speedometer has a display resolution of 512 steps per 360 degrees of pointer sweep, this number of steps can provide a perceived smooth needle movement without the need for excessively large counters or look-up tables. If a distance sensor provides 8,000 pulses per mile, a speedometer dial with the above resolution could indicate speeds up to 125 miles per hour over a sweep range of 270 degrees. With these relationships known, the distance pulse frequency for one step of the pointer can be determined as follows in equation 1:

$$1 \text{ step} \times 360^\circ \div 512 \text{ step} \times 125 \text{ miles/hour} \div 270^\circ \times 1 \text{ hour} \div 3600 \text{ seconds} \times 8000 \text{ pulses} \div 1 \text{ mile} = 0.7233 \text{ hertz} \quad (1)$$

The distance pulse period of one step is the reciprocal of the computed frequency or 1.3824 seconds. Similarly, the distance pulse frequency at 125 mph, or 384 steps, equals 277.77 hertz which translates to a period of 3600 microseconds.

For slow speeds of the drive shaft, the period of each pulse is measured to provide the quickest update of speed information possible. For higher frequencies (high speed), to accurately distinguish between one speed and the next requires a count of many distance pulses. Both high and low speed measurements require between 3.6 milliseconds and 1382 millisecond time intervals.

In order to distinguish between steps at high speeds, a count clock period of about 4.5 microseconds is required. A period counter used for counting clock pulses during the distance pulse periods must, therefore, have the capacity of counting up to a decimal value of about 300,000. A counter of 262144 decimal binary (17 bits) or a modulo 18 can provide adequate resolution at the high speed end as well as a sufficient count at the low speed end. When the slowest displayable speed occurs, the counter will have a count of 262144; and, when the crank case stops, the counter will roll over to cause the displayed speed to indicate a zero.

By dividing the count length, 262144, by the longest measurable speed period, 1.3824 seconds, yields the clock frequency of the period counter. To obtain a period count frequency of 189.63 kilohertz, select an oscillator circuit having a frequency of ten times the counter clock frequency. This will allow the generation of addition clock edges to sequence data and control signals throughout the circuitry.

GENERATING CLOCK SIGNALS

In measuring the period between leading edges of the distance sensor pulses, several clock signals provide synchronization between the sequential and combination logic circuits employed in this embodiment.

In FIG. 1, a crystal oscillator circuit 14 driven by a crystal 12 produces an output clock signal (OSC) and an inverted oscillator signal (NOSC) at an output terminal of an inverter 16.

In order to generate a signal called clock D (CLKD) having a frequency of 1/10 of OSC frequency, the OSC signal routes to a clock input terminal of a 3 bit counter 18 (a modulo 5 counter). The first, second and third stages of this counter provide inputs to NAND gate 20.

Enabling the output of NAND gate 20 occurs only when the third stage goes to a logical 1 state.

A logical output signal from NAND gate 20 routes to a D input terminal of a reset flip-flop 22. The Q output changes to the level of the signal at the D input when the NOSC signal provides a transition from a logical 0 to a logical 1 (a rising edge) at the clock input of flip-flop 22. When the D input of flip-flop 22 goes to a logical 0, the next rising edge of the NOSC signal causes a toggle effect that temporarily stores a logical 1 at the not Q (QN) output. This QN signal enters an inverter 23 and emerges as a DIV-CLK signal which routes to both a clock input terminal of a CLOCK D (CLKD) flip-flop 24 and to the reset terminal of the 3-bit counter 18. The signal at the clock input terminal of flip-flop 24 moves the logic level at the D input to the Q output port generating a square-wave signal called CLKD. The CLKD signal routes to a B input of a multiplexer 28. If the set or (S input) of multiplexer 28 does not receive a logical 1 ENABLE AVERAGING (ENAVG) input signal, then the signal at the B input (CLKD) passes through to the Q output. This signal becomes a not CONTROL CLOCK (NCCLK) signal. If the S input of multiplexer 28 receives a logical 0 ENAVG signal, then the A input is selected. This means the CLKD signal which applies to an input terminal of a DIVIDE-BY-8 circuit 26 has its frequency divided by 8.0. This divided-by-8 CLKD signal routes to the A input of multiplexer 28. If a logical 1 ENAVG signal appears at the S terminal, then a NCCLK signal of a frequency $\frac{1}{8}$ of that of CLKD routes to the Q output. The CLKD signal has a frequency which is 1/10 of the OSC frequency. Hence, the NCCLK signal is $\frac{1}{8}$ of 1/10 of the OSC frequency.

A logical 1 ENAVG signal results if bits 13, 14, 15 and 16 from "A" bus 74 (described infra) occur as logical 0 signals during the occurrence of a rising edge of an average distance pulse (ADP) signal. This results if the drive shaft speed exceeds 26.037 mph. If anyone of these "A" bus bits becomes a logical 1, then a logical 0 ENAVG signal results indicating a drive shaft speed lower than 26.037 mph.

The NCCLK signal from multiplexer 28 routes to an input of NAND gate 30 and passes to the output of gate 30 as a CCLK signal when a high period count enable signal (PCE) (described supra) occurs at another input of gate 30.

The NCLKD signal (which is 1/10 of the oscillator frequency) routes to an input of a NAND gate 25 and passes to the output when reset flip-flop 22 is toggled. This output signal passes through an inverter 27 to generate a filtered clock pulse (FLT-CLK).

BOUNCE REMOVAL

As mentioned previously, distance sensor 32, a conventional electromechanical transducer, provides a series of ON and OFF ground switch closures. Rapid ground switch closures cause a switch bounce reaction. As much as 50 microseconds of switch bounces can exist in distance sensors such as the one used in this invention. The following portion of system 10 removes the bounce effects from the switch contact signals of distance sensor 32.

An indication of switch bounce removal results if a filtered distance pulse signal (FDP) generates from a debounce distance pulse flip-flop 50. The FDP signal occurs if a valid edge signal (VE) issues from a valid edge flip-flop 46. Flip-flop 46 issues a VE signal on the rising edge of FLT-CLK while a logical 1 data signal from NOR gate 44 applies to the D input of valid edge flip-flop 46. This logical 1 signal outputs from NOR gate 44 if 2° bit counter 42 counts to 25. Counter 42 counts to 25 if 25 FLT-CLK pulses are received at the clock input of counter 42 and a NOT RESET input remains at a logical 1 during the 25 ticks of the FLT-CLK signal.

A logical 1 reset signal applies to the NOT RESET terminal of counter 42 if the combinational logic comprised of inverter 43, NAND gate 41, NAND gate 40C and NAND gates 40A and 40B combine to provide a logical 1 signal at the NOT RESET terminal of counter 42. The logical 1 reset signal occurs if the output of inverter 43 provides a logical 1 signal in response to a logical 0 signal from NAND gate 41. The output of NAND gate 41 remains a logical 0 as long as a MASTER RESET signal (MSTR-RES) remains a logical 1 and the output from NAND gate 40C remains a logical 1. If the output from NAND gate 40A is a logical 0 signal while the output from 40B is a logical 1 signal, the output of NAND gate 40A remains a logical 0 if a NOT FILTERED DISTANCE pulse (NFDP) and a buffered distance pulse (BDP) signal both remain logical 1. The output of NAND gate 40B remains a logical 1 if either of the FDP signals or the not buffered distance pulse signal (NBDP) remain a logical 0. A logical 1 FDP signal cannot be generated until a VE signal occurs. This cannot occur until a BDP signal is sampled.

Each pulse from distance sensor 32 emanates as a raw distance pulse signal (RDP). An RC-filter circuit and zener diode combination circuit 34 initially filters the raw distance pulse signal and limits it to an amplitude of approximately 5 volts. Then this limited RDP signal enters a Schmitt trigger circuit 36. Circuit 36 produces at an output terminal a buffered distance pulse signal (BDP). This BDP signal enters a D input of a sampling flip-flop 38 and is clocked through this D flip-flop by a NCLKD clock signal which is 1/10 the frequency of oscillation of the OSC signal. The Q output of flip-flop 38 provides a sample distance pulse signal (SMDP) to an input of NAND gate 40A. This signal is equivalent to the BDP signal mentioned supra.

CONTROL SIGNALS

Several control signals utilized in this invention are generated by the following circuits. A NOT ZERO HOLD (NZERHLD) signal generates if a NZERHLD flip-flop 51 sets in response to the rising edge of the FDP signal applied to a clock input while a logic 1 is applied by an S0 signal (a5 VDC reference signal) at the D input of flip-flop 51 or a logic 0 S0 signal is applied to an S input of flip-flop 51. Flip-flop 51 resets if the speed of the vehicle or machine goes to 0 and a speed 0 signal (SPD0) applies to an input of NOR gate 53 producing a low signal at a reset terminal of flip-flop 51. This logical 0 signal also is inverted twice by a pair of inverters to produce a logical 0 MSTRRES signal at the output of inverter 55. The identical signal is produced if a logical 0 RESET signal occurs and applies to another input of NOR gate 53 as an inverted signal. The RESET signal occurs each time the ignition voltage is turned on causing an RC circuit 61 to produce an integrated voltage signal (RESET) as the capacitor of the RC circuit charges from 0 up towards the ignition voltage.

PERIOD COUNTING

Also in FIG. 1, period counter 66 counts the period of the FDP. The FDP is originally generated external to system 10 and sensed as pulse signals from the distance sensor 32. The period counter 66 is clocked from internally generated clock signal (CCLK). When a valid edge (VE) is detected, the DDP flip-flop 50, upon the receipt of a rising VE signal, samples the signal on the D input and transfers it to the Q output, generating the filtered distance pulse signal (FDP). The FDP signal is divided by 8 by a divider 54 to generate an average distance pulse (ADP) signal. Multiplexer 52 looks at the A (ADP) and B (FDP) inputs and, if the S terminal of multiplexer 52 has a logical 1 ENAVG signal applied, when the vehicle speed is above 26 MPH, then the ADP signal exits the Q output and, if the ENAVG signal is logical 0, then the FDP signal is transferred to the Q output.

When a rising edge of either the ADP or FDP signal enters the clock input of a counter latch flip-flop 56, this flip-flop samples the signal on the D input and transfers it to the Q output terminal. Under normal conditions, the signal on the D input is a logical 1. Hence, the logical 1 Q output signal becomes a PERIOD COUNT LATCH (PCL) pulse which is used to latch the count from period counter 66 into the DIVISION REGISTERS of latch 70. This permits a logical 1 NOT-PERIOD-COUNTER ENABLE (NPCE) signal to reset the period counter 66. The logical 1 NPCE signal occurs when flip-flop 56 temporarily stores a high PCL signal which applies to the D input of COUNT ENABLE flip-flop 60.

Upon the first effective rising edge of the OSC signal, flip-flop 60 samples the D input signal and transfers it to the Q output. When the D input signal is a logical 1 PCL signal, then the Q output signal becomes a logical 1 NPCE signal. This signal not only resets the period counter 66, but it also resets the COUNT LATCH flip-flop 56. When flip-flop 56 resets, the D terminal of flip-flop 60 will receive a logical 0 and the next rising edge of the OSC signal will cause flip-flop 60 to sample the logical 0 signal at the D input and transfer it to the Q output as a logical 0 NPCE signal which will enable the PERIOD COUNTER 66 to start counting.

Period counter 66 will count the CCLK signals via NAND gate 62 as clock 0 signals (CLK0) until PCL signal returns to a logical 1. The PCL signal returns to a logical 1 level when a rising edge of another VE signal causes flip-flop 50 to sample the D input signal. If the D input signal is a logical 1, then this rising edge signal will multiplex through multiplexer 52 to the clock input of the COUNT LATCH flip-flop 56. This rising edge at the clock input of flip-flop 56 will cause this flip-flop to sample the signal at the D input which, at this time, will be a logical 1 level signal. This logical 1 level signal will transfer to the Q output as a logical 1 PCL signal. This PCL signal will latch the count from PERIOD COUNTER 66 into LATCH 70.

The count latch in LATCH 70 represents the number of CCLK ticks counted by PERIOD COUNTER 66. At 0.3255 mph, the counter 66 counts up to 262144 counts which equals a period of about 1.3824 seconds. At 125 mph, counter 66 counts up to a count of 682 which is equivalent to a count period of $3600\times10^{-6}$ seconds.

To calculate the speed from a given count, the count must be converted to angular steps of deflection and then the steps must be converted to mph using speedometer graphics overlays.

Illustratively, the maximum count of the period counter 66, which is 262144, is divided by the measured period count. In this case, it is 2844. This equals 92.17 or 92 steps of deflection of a gauge pointer. The 92 steps of deflection is converted to mph by multiplying 92 steps$\times$125 miles/270° hour$\times$360°/512 steps$=$29.95 mph. (This assumes we are using a speedometer that has a dial that spans 270. Such a deflection of the dial needle represents 125 mph).

Similarly, for 65 mph, 65 mph$\times$8000 pulses/miles$\times$1 hour/3600 sec.$=$144.4 Hz.

The distance pulse period equals 6.923 ms (1/144.4 Hz). When not averaging, the period count interval equals 5.273 $\mu$s (the period of the OSC signal). Therefore, 6.923 ms$+$5.273 $\mu$s equals 1312 counts.

When averaging, the period count interval equals 42.184 $\mu$s (5.273 $\mu$s$\times$8) and the average distance pulse period equals 65.384 ms. Therefore, 65.384 ms$\div$42.184 $\mu$s$=$1312 counts.

To convert to steps of deflection, 262144 is divided by 1312 which$=$199 steps. Then 199 steps$\times$125 miles/270° hours$\times$360° $+$12 steps$=$64.78 mph.

As mentioned previously, the averaging is done when the speeds exceed approximately 26 mph because jitter would occur if averaging was not incorporated. Also note that the period count 1312 is the same whether or not averaging is required allowing additional circuitry to interface with the DIV-REG 70 in the same manner whether averaging is enabled or not.

FLOW CHARTS

Referring now to the flow charts of FIGS. 2–6, these charts represent an effort to organize the generation and flow of signals through system 10. These charts differ from the conventional box and diamond flow charts. In these charts, signals entering and leaving the flow of control pass along lines and proceed down the page. Conventional start up of program and end of program boxes are used. Trapezoidal shaped boxes indicate signals entering and leaving the flow of control. Actions are signified by a small black circle on the lines, the description of the action being given to the left or right of the flow lines. When introducing a decision, the flow line branches to the right or left. A branch may be caused by either a YES or NO condition, with these being signified by a Y or N in a small box as indicated. An arrowhead depicts where secondary flow rejoins the main flow. A reference number indicates the position or step along the line being discussed.

Figure 15:
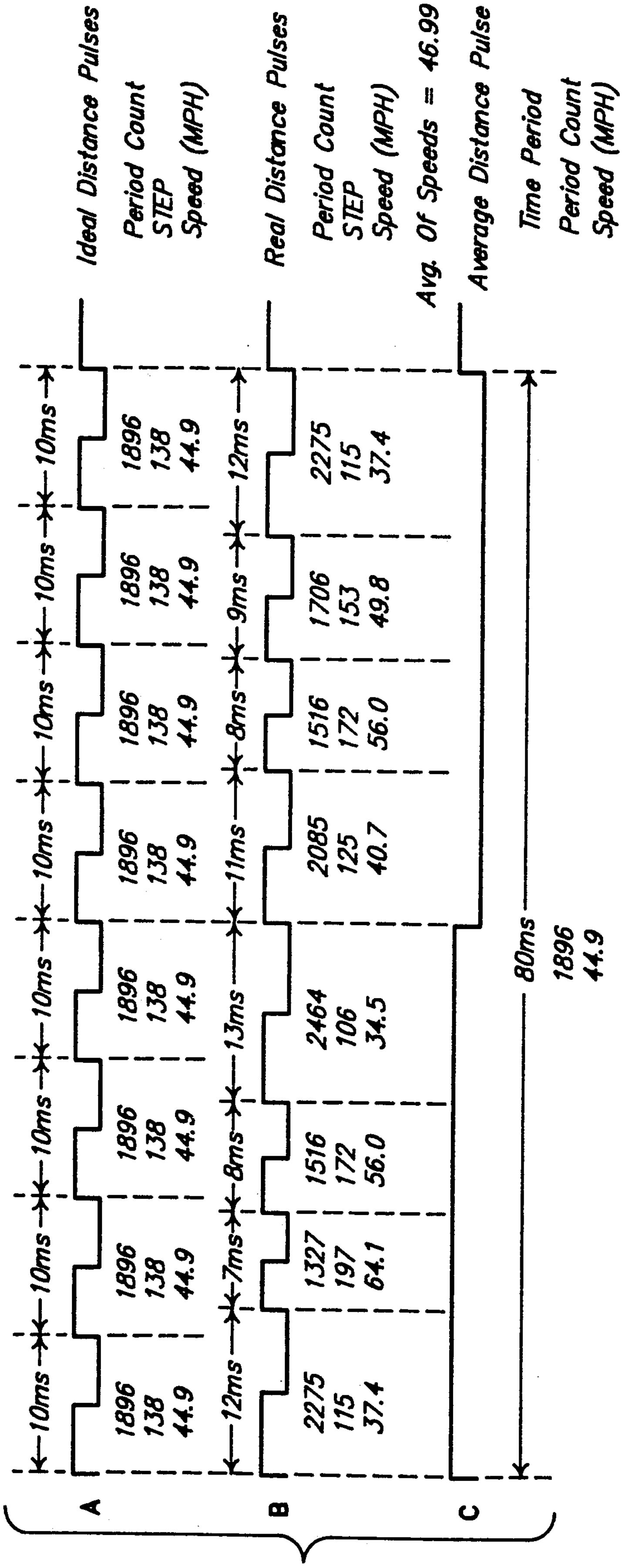

In an effort to further organize the generation and flow of signals through system 10, while describing the steps of the flow of control in the flow charts, the timing diagrams of FIG. 15 will be referred to along with the logic diagram of FIG. 1.

Figure 2:
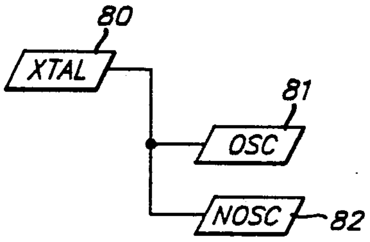
FIGS. 2 through 6 depict in flowchart form operation of the measuring unit of FIG. 1.

FIG. 2, steps 80–82 depict the generation of the OSC and NOSC output signals from the reference signal provided by crystal oscillator 12 of FIG. 1. As indicated in FIG. 7, the OSC signal and the NOSC signal (the NOSC signal being the inverse of OSC) have a pulse repetition period of about 527 ns.

DIVCLK

Figure 3:
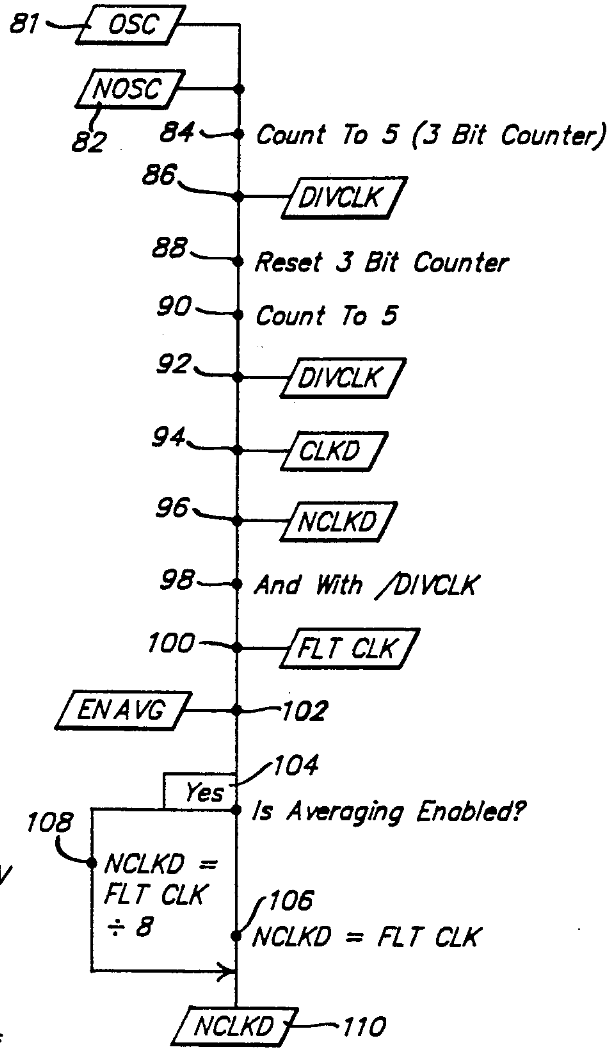

As indicated at FIG. 3 step 86, system 10 uses the OSC and NOSC signals to generate the DIVCLK signal. The three bit counter 18 of FIG. 1 counts to five (step 84 of FIG. 3) in response to the OSC pulses and then the QN output of flip-flop 22 returns a pulse to the 3-bit counter 18 resetting the counter back to zero.

On the next series of OSC pulses, counter 18 counts to 5 again and then issues a data pulse to flip-flop 22.

Flip-flop 22 transfers this data pulse to a Q output on the next rising edge of the NOSC pulse, generating the DIVCLK signal. FIGS. 7 B-G depicts the timing waveforms associated with steps 84 and 86 of FIG. 3.

FLT-CLK

Steps 94–100 of FIG. 3 depict the manner system 10 generates the FLT-CLK signal. Also, FIGS. 7 G-I illustrates the timing associated with the generation of the FLT-CLK signal. Each rising edge of the asymmetrical DIVCLK signal causes system 10 to generate a square-wave CLKD signal wherein the pulses of the CLKD square-wave have a pulse width of about 2.63 microseconds. The DIVCLK signal routes from inverter 23 of FIG. 1 and goes to the CLK input of the CLKD flip-flop 24 to affect the generation of the CLKD square-wave signal.

The NCLKD signal along with the NDIVCLK signal becomes input signals to NAND gate 25 of FIG. 1 and the output of gate 25 gets inverted by inverter 27 to generate the FLT-CLK signal. This FLT-CLK signal has an OFF time of about 5.27 microseconds and an ON time of about 527 nanoseconds.

Figure 12:
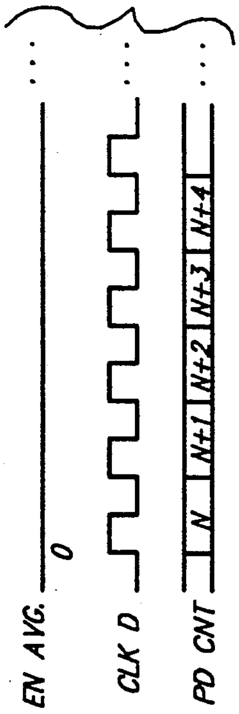
Figure 13:
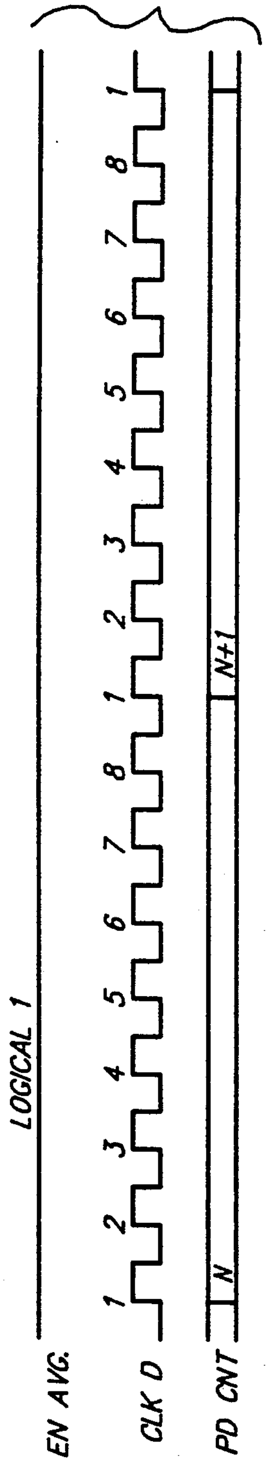

Steps 102–110 of FIG. 3 depict the operation of system 10 when using CLKD for low and high speed distance sensor pulse measuring. If the measured speed exceeds 26 mph, then the ENAVG flip-flop 29 generates an ENAVG signal and the CLKD signal is divided by 8. Multiplexer 28 routes this decreased-frequency signal to the period counter 66 for generating the period count of the distance pulses. When the speed does not exceed 26 mph, then the ENAVG signal is not generated. The CLKD signal without any alterations routes through multiplexer 28 to the period counter 66 for generating the period count of the distance pulses. The waveforms of FIGS. 12 and 13 depict the CLKD signal when the ENAVG signal is logical 0 and when the ENAVG signal is logical 1 respectively.

VALID EDGE DETECTION

Figure 4:
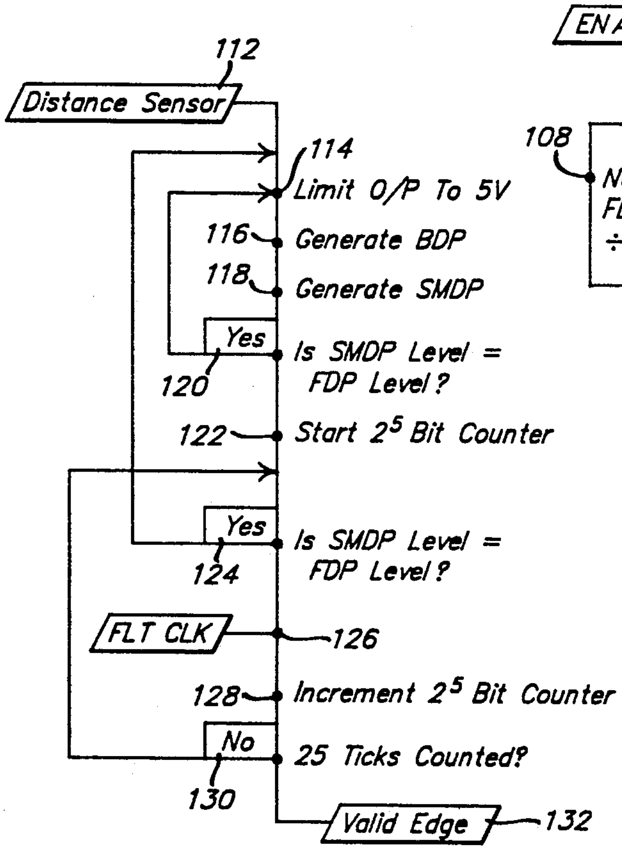

FIG. 4, steps 112 through 132 depicts the generation of valid edges (VE) in response to distance sensor pulses. System 10 receives the distance sensor pulses (step 112) and immediately filters the pulses, limiting the amplitude of the pulses to 5 volts dc (step 114).

The pulse then routes to the input of Schmitt trigger 36 of FIG. 1 which produces at an output the buffered distance pulse (BDP) signal as indicated at step 116 of FIG. 4. NCLKD signals at the CLK input of flip-flop 38 causes the flip-flop to sample the BDP signal before producing at a Q-output terminal the sampled distance pulse (SMDP) signal (step 118 of FIG. 4).

Then as indicated at step 120, system 10 makes a determination as to whether the SMDP equals the FDP. When these two signals are equal, then counter 42 is reset. When these two signals are not equal, counter 42 starts counting as in step 122.

If while counter 42 counts toward 25, the SMDP and the FDP become equal in polarity, then counter 42 will reset as indicated at step 124. If these two pulses are not of the same polarity, counter 42 will again start counting and will count until 25 ticks of the FLT-CLK signal is counted by counter 42 (steps 126–130). After the 25 ticks are counted, the valid edge flip-flop 46 of FIG. 1 will issue a VE signal (step 132 of FIG. 4). FIGS. 8 C-G depict the timing associated with the generation of the VE signal.

GENERATING PCL AND PCE

Figure 5:
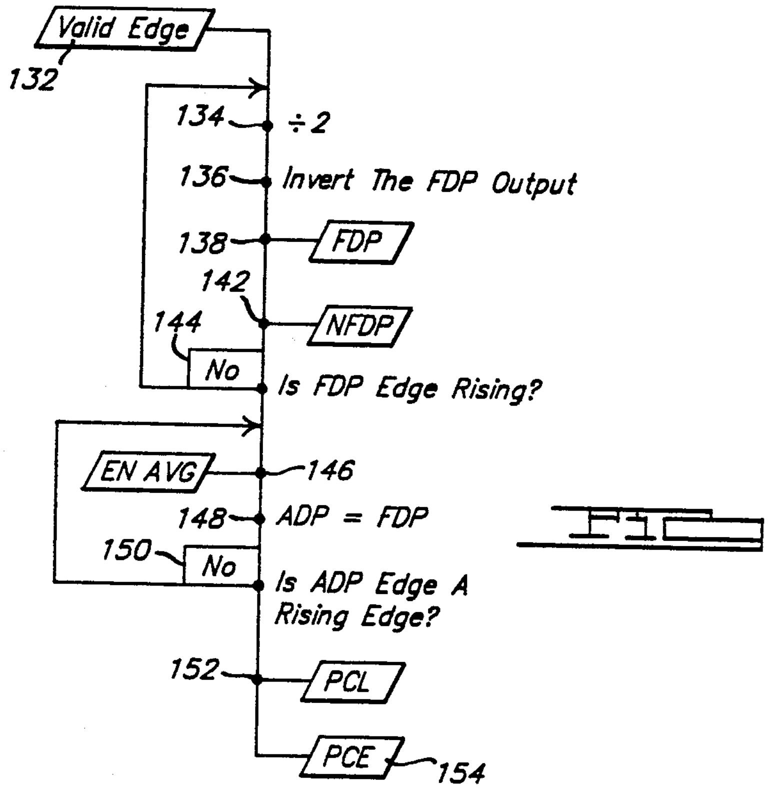

Steps 132–154 of FIG. 5 depicts the operations of system 10 in generating PCL and PCE. Upon the receipt of a valid edge signal (step 132), a DEBOUNCE flip-flop 50 of FIG. 1 divides the VE signal by 2 (step 134 of FIG. 5) and generates at a Q-output terminal the filtered distance pulse signal (FDP). Each VE signal inverts the FDP and NFDP signals (steps 136–142).

System 10 then determines whether the front edge of FDP is rising?. If not, the toggle procedure continues.

When system 10 is averaging, i.e., the speed being detected is above 26 mph, then the average distance pulse (ADP) is equal to the filtered distance pulse (FDP) as in steps 146–148.

Then system 10 makes a determination of whether the ADP is a rising edge. If not, then system continues to average the FDP. If it is a rising edge then system 10 generates the period counter latch (PCL) signal first and then the period counter enable (PCE) signal following it.

Figure 6:
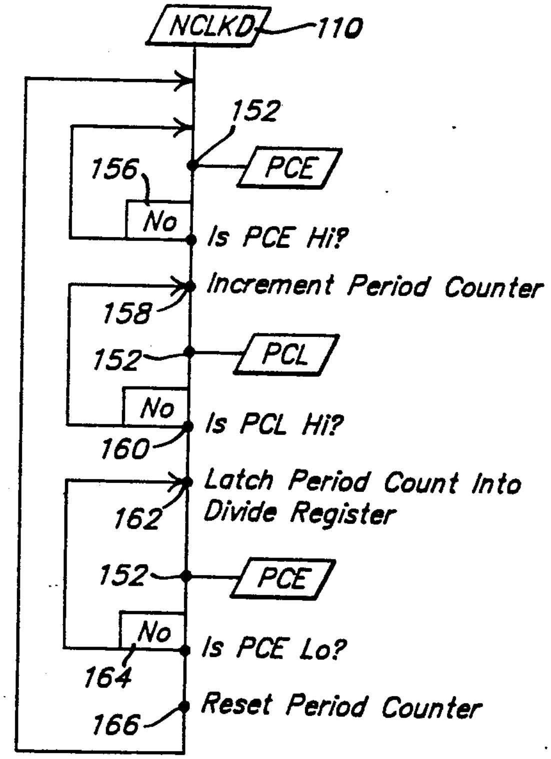
Figure 4:
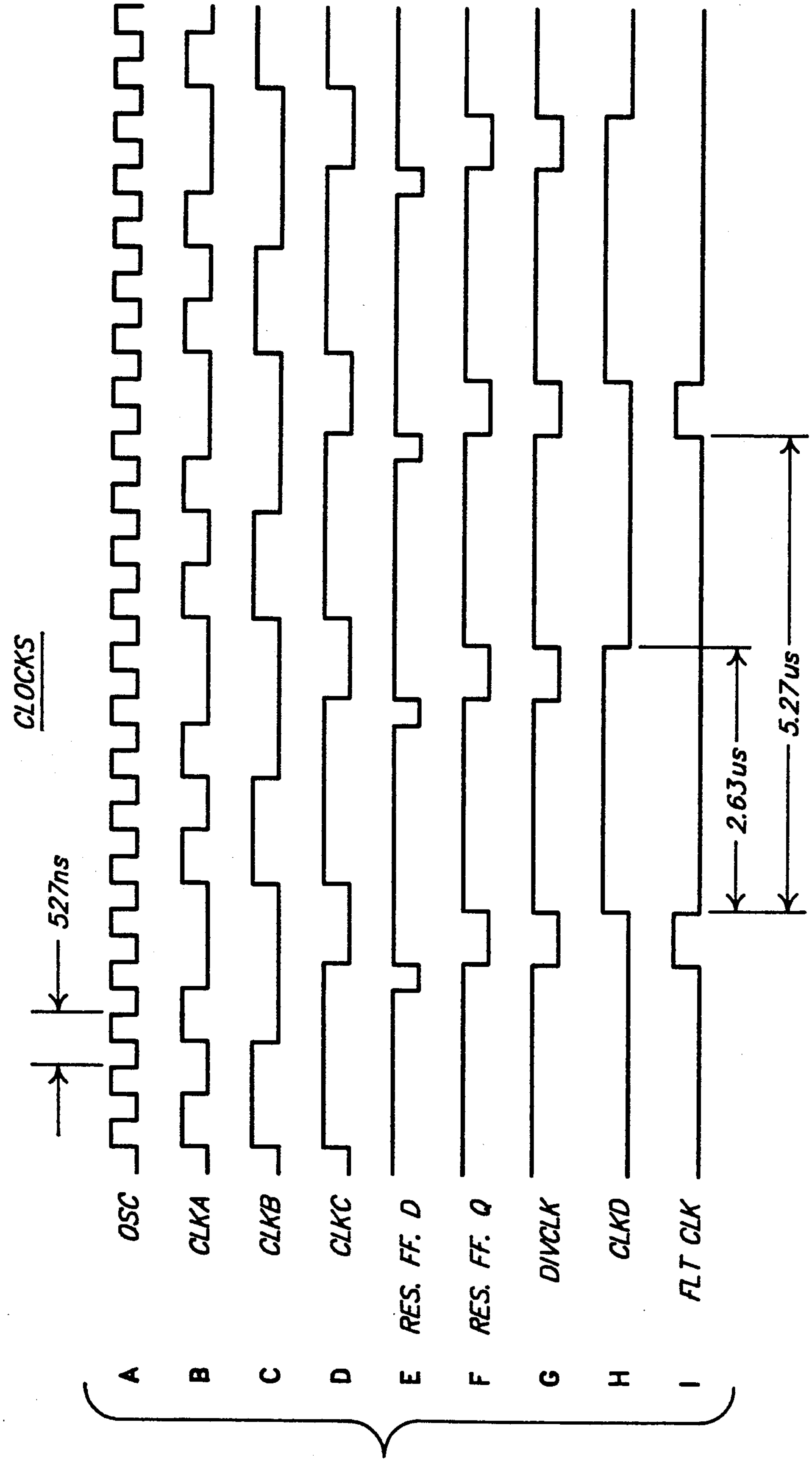
Figure 5:
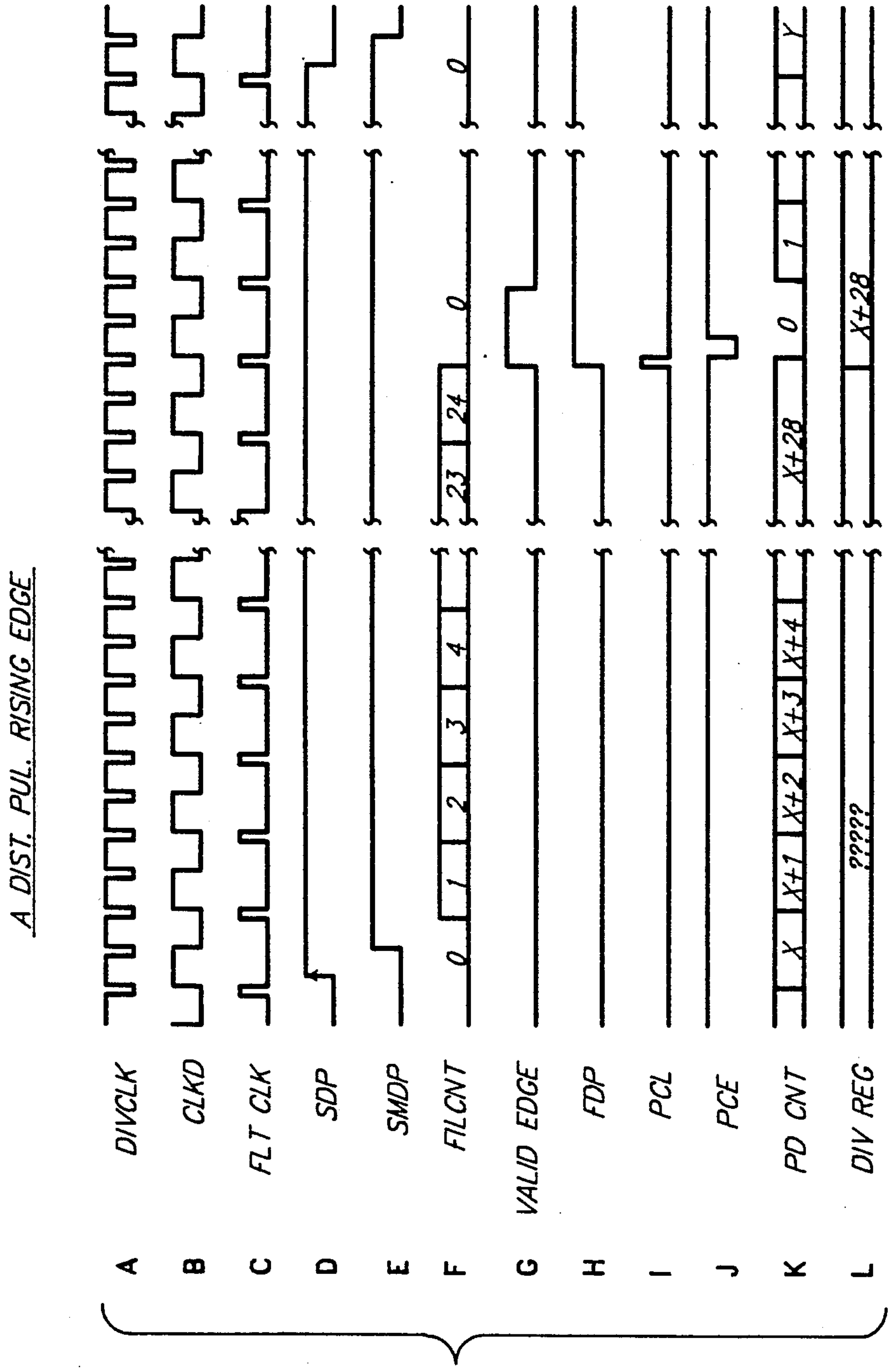

FIG. 6 depicts the use of the PCL and PCE signals. The period counter 66 incrementally counts the CCLK signals upon the receipt of each logical 1 PCE signal while the PCL signal is a logical 0 as indicated in steps 152–166.

When the PCL signal is a logical 1 signal, system 10 latches the contents of the period counter into the divide registers (DIV-REG).

When the PCE signal is a logical 0, the period counter is reset.

TIMING DIAGRAMS

To further explain the operation of system 10, refer now to the timing diagrams of FIGS. 7–15. As explained supra, FIGS. 7 A–I shows the timing related to the generation of the clock signals of system 10. The PERIOD COUNTER frequency equals the frequency of the CCLK signal. CLKD, a square wave signal, dictates the frequencies of CCLK and FLT-CLK, while OSC dictates that of CLKD. CLKD has a frequency 1/10 of that of OSC. The DIVCLK signal, an asymmetrical signal containing a negative polarity pulse that occurs at 1/5 the frequency of OSC triggers polarity changes of the square-wave CLKD signal.

With reference now to FIGS. 8 A–L, these diagrams show the reactions occurring in system 10 during a rising edge of a distance pulse signal. These waveforms are sectioned into three parts in order to compress the reactions due to the length of the signals. In FIG. 8 A, the DIVCLK signal is shown distorted in form, but it does provide the pulses needed to cause the polarity changes of CLKD of FIG. 8 B.

As depicted in FIGS. 8–A, B and C, FLT-CLK generates in response to a LOW DIVCLK and a LOW CLKD. Hence, a positive polarity FLT-CLK pulse occurs at 1/10 the frequency of OSC.

Measurement of the distance pulse signals start at the generation of the BDP signals (FIG. 8D). System 10 seeks a rising VALID EDGE of each of the distance pulses. This procedure assures that system 10 operates on valid signals as opposed to invalid signals which might be noise glitches or other undesirable signals. The SMDP signal cooperates with system 10 to initiate counter 42 of FIG. 1 so as to count 25 FLT-CLK pulses as long as the polarity of FDP and SMDP are not the same. Upon completing the count of 25 FLT-CLK pulses, the VALID EDGE of the initial distance sensor pulse is confirmed as indicated in FIGS. 8 C-H.

To clear the PERIOD COUNTER 66 of FIG. 1 of its contents so as to count the next period of time between valid edges, a PERIOD COUNTER LATCH pulse (PCL) generates. This pulse causes the contents of the PERIOD COUNTER to latch in the DIV-REG 70 of FIG. 1. FIG. 8I shows the PCL pulse, FIG. 8K shows the content of the PERIOD COUNTER 66 and FIG. 8L shows the transfer of the content of the PERIOD COUNTER into the DIV-REG.

With reference to FIGS. 9 A–L, these waveforms depict the reactions of system 10 during the detection of the falling edge of the initial distance pulse of FIG. 8. As shown in FIGS. 9D through H, a LOW BDP with a HIGH SMDP signal causes counter 42 of FIG. 1 to reset and to start anew in counting FLT-CLK pulses.

As shown in FIGS. 9F, G and H, after 25 FLT-CLK signals are counted, a HIGH VALID EDGE signal and a LOW FDP signal generates confirming the descending edge of the initial distance sensor pulse signal. Note that FIG. 9K shows that the period counter continues to count time (CCLK) signals between the initial distance sensor pulse and the next distance sensor pulse.

Figure 10:
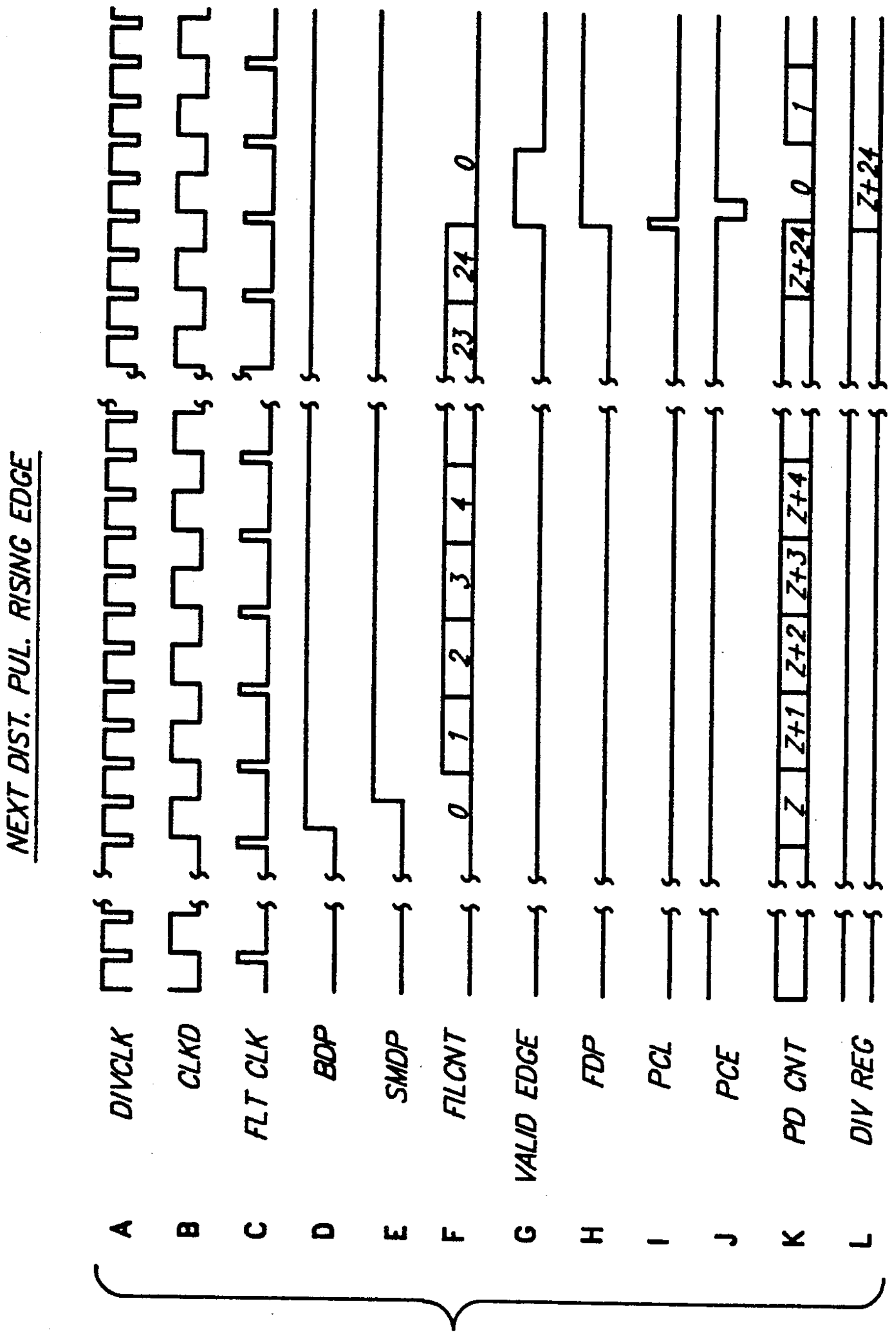
Figure 11:
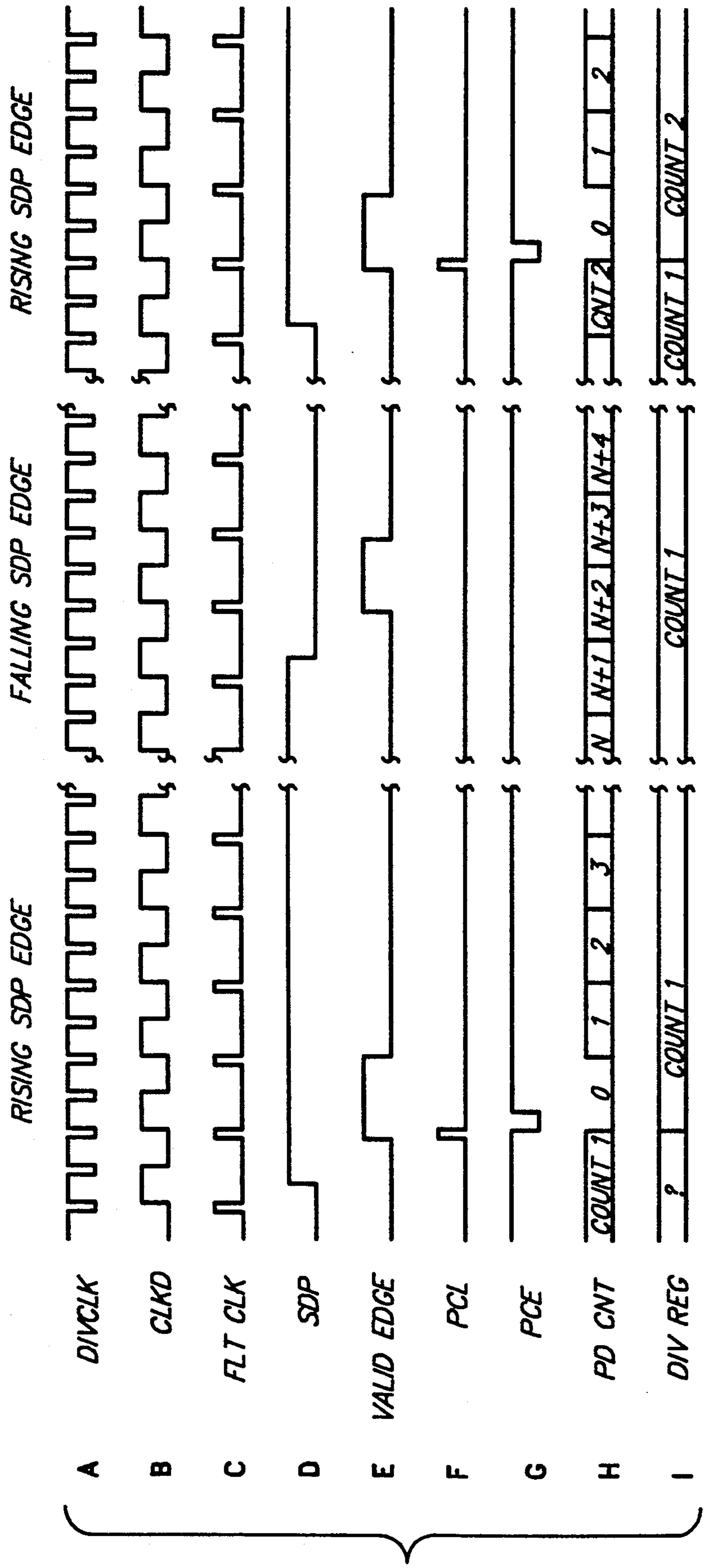

FIGS. 10 A–L shows the occurrence of the rising edge of the next distance pulse. With FDP and SMDP not at the same polarity, counter 42 of FIG. 1 is enabled to count 25 FLT-CLK signals to affirm the occurrence of a valid edge of the next distance pulse (see FIGS. 10 E–H).

Upon detection of the valid edge of the next distance pulse, another PCL pulse generates that places the count in the period counter 66 into the DIV-REG 70. The inverse of this count provides the frequency of the distance pulse signals. The frequency then is converted into mph by the relations established supra.

Note that in FIG. 10J, the PCE pulse starts the period counter 66 for counting the next distance pulse signal.

With reference now to FIGS. 11A–I, these waveforms summarize reactions of system 10 in operating on the distance pulse signals to measure the period between two valid leading edges of adjacent distance pulses. Note in FIGS. 11 E and F that the falling edge of the initial pulse has no effect on the period counter whereas the leading edge of both the initial and next distance pulse do affect the period counter count.

FIG. 12 shows system 10 counting CLKD pulses when the speed being measured is below 26 mph.

FIG. 13 shows system 10 counting CLKD pulses when the speed being measured is above 26 mph.

Figure 14:
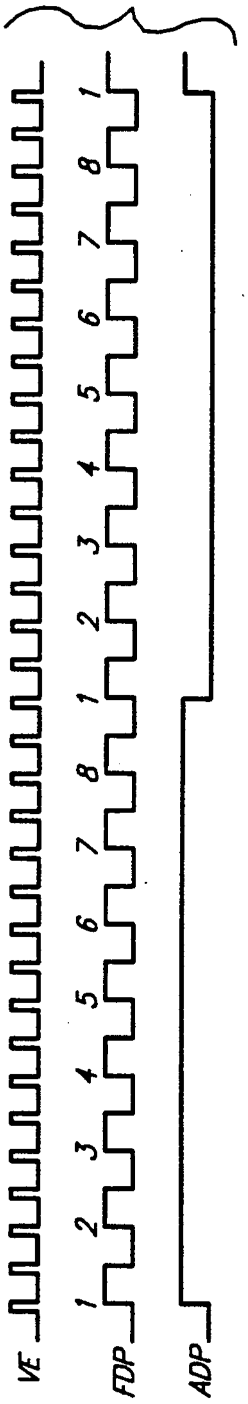

FIG. 14 shows the period counter counting at ⅛ the normal speed and the averaged distance pulses coming at ⅛ the normal rate.

FIG. 15A depicts the ideal response to pulses from an ideal distance sensor that emits symmetrical 10 ms distance sensor pulses. Note that the speed, the steps of the gauge pointer and the period counted by the period counter are all consistent.

FIG. 15B depicts the reaction of a real distance sensor that emits asymmetrical 7–12 ms distance sensor pulses. Note that the average speed of such a device is 46.99 mph.

FIG. 15C depicts a real distance pulse that has been averaged. Its time period is 8 times that of the periods of the pulses in FIGS. 15A and B. Note that the speed is equivalent to the ideal distance pulse speed.

I claim:

1. Apparatus for measuring periods between edges of asymmetrical pulses emanating from a measurand sensor with respect to a reference clock signal, said sensor pulses varying in frequency in proportion to rates of change of the measurand; said system comprising:

(a) clock means, having an internal reference clock oscillator, and generating therefrom: (1) a first period-counting, control- clock (1stCCLK) signal of a chosen frequency apportioned to a fixed frequency of the oscillator, (2) a second period-counting, control-clock (2ndCCLK) signal of another chosen frequency apportioned to the frequency of said 1stCCLK signal and (3) a filtered-clock (FLT-CLK) signal of the same frequency as that of said first period-counting, control-clock signal for providing clock signals used to establish valid edges of the sensor pulses;

(b) valid edge detection means having an input terminal for receiving each raw pulse signal from the sensor and another terminal for receiving said FLT-CLK signals and producing therefrom an initial valid edge (VE) pulse signal indicative of a valid edge of that raw pulse signal after buffering the raw pulse signal and after that buffered signal remains for a chosen number of pulses, in series, of said FLT-CLK signal;

(c) counting means responsive to each VE signal during the receipt of each raw pulse signal and having a terminal for receiving said 1stCCLK and 2ndCCLL signals, said oscillator signal and a signal that indicates whether the frequency of said raw pulse is greater than a chosen frequency of pulses from said sensor and producing therefrom in a storage register a count of said 1stCCLK signal pulses if the frequency of said raw pulse is less than the chosen sensor pulse frequency or a count of said 2ndCCLK signal if the frequency of said raw pulse is greater than the chosen sensor pulse frequency, said counting terminating upon the receipt of a next VE signal.

2. Apparatus in accordance, with claim 1 wherein after a VE signal occurs, a latch means latches a count of the number of pulses of said 1st OR 2nd CCLK signals counted by said counting means in said storage register and afterwards, a counting means enable signal resets said counting means to permit counting the next series of 1st or 2nd CCLK signals, the count latched in said storage register being a measure of a period between the initial VE and the next VE pulse signal.

3. Apparatus in accordance with claim 2 wherein said chosen sensor pulse frequency is about 58 hertz, wherein said oscillator frequency is about 1.9 megacycles, wherein said 1stCClk and 2nd CClk signal are 1/10 and 1/80 of the oscillator frequency.

4. Apparatus in accordance with claim 3 wherein the period counted between the valid edge and the next valid edge of the sensor pulses is the same whether the 1st or 2nd CCLK signals are counted and wherein the 2nd CCLK signal is used to aid the removal of the asymmetrical effects of the sensor pulses of frequencies of 58 hertz.

* * * * *